United States Patent
Chan et al.

(10) Patent No.: US 9,246,113 B2
(45) Date of Patent: *Jan. 26, 2016

(54) JUNCTION FIELD-EFFECT QUANTUM DOT MEMORY SWITCH

(71) Applicant: International Business Machines Corporation, Armonk, NY (US)

(72) Inventors: Kevin K. Chan, Staten Island, NY (US); Tze-Chiang Chen, Yorktown Heights, NY (US); Kailash Gopalakrishnan, San Jose, CA (US); Wilfried Ernst-August Haensch, Somers, NY (US); Bahman Hekmatshoartabari, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/181,302

(22) Filed: Feb. 14, 2014

(65) Prior Publication Data

US 2015/0236284 A1 Aug. 20, 2015

(51) Int. Cl.
*H01L 29/76* (2006.01)
*H01L 51/05* (2006.01)
*G11C 11/40* (2006.01)

(52) U.S. Cl.
CPC ............ *H01L 51/0562* (2013.01); *G11C 11/40* (2013.01); *H01L 51/0541* (2013.01)

(58) Field of Classification Search
CPC .................. H01L 27/11517; H01L 27/11563; H01L 29/66833
USPC .......................... 257/314, 315, 320, 321, 324
See application file for complete search history.

(56) References Cited

U.S. PATENT DOCUMENTS

| | | |
|---|---|---|
| 5,608,231 A | 3/1997 | Ugajin |
| 6,333,214 B1 | 12/2001 | Kim |
| 6,597,036 B1 | 7/2003 | Lee |
| 6,894,352 B2 | 5/2005 | Hu |
| 7,105,874 B2 | 9/2006 | Chae |
| 7,605,065 B2 | 10/2009 | Jang |
| 7,629,244 B2 | 12/2009 | Chae |
| 8,174,023 B2 | 5/2012 | Chen |
| 8,278,647 B2 | 10/2012 | Holme |

FOREIGN PATENT DOCUMENTS

JP 7176763 7/1995

OTHER PUBLICATIONS

Sangyeon Han et al., "Silicon MOS Memory with Self-Aligned Quantum Dot on Narrow Channel", IEEE, 2009, pp. 187-189.

*Primary Examiner* — Tan N Tran
(74) *Attorney, Agent, or Firm* — Louis J. Percello; Otterstedt, Ellenbogen & Krammer, LLP

(57) ABSTRACT

A dense binary memory switch device combines the function of a pass transistor and a memory cell and has low programming and operation voltages. The device includes a charge storage region coupled to a gate electrode through a gate dielectric layer and directly contacting a channel region. The charge storage region contains quantum structures, deep traps or combinations thereof and is charged by carriers injected from injection regions that are in direct contact with the charge storage region. Fabrication of the device at low temperatures compatible with back-end-of-line processing is further disclosed.

20 Claims, 12 Drawing Sheets

JUNCTION FIELD-EFFECT QUANTUM DOT MEMORY SWITCH

FIELD

The present disclosure relates to the physical sciences and, more particularly, to memory switch devices and methods of fabrication thereof.

BACKGROUND

Field programmable gate arrays (FPGAs) are integrated circuits generally characterized by configurable logic blocks with programmable interconnects. FPGAs are designed to be reprogrammed subsequent to manufacture. A combination of a pass transistor and a memory cell such as static random access memory (SRAM) is conventionally used as a binary memory wiring switch in FPGAs. The area taken by the pass transistor and the SRAM cell (comprised of several transistors) is a large fraction of the total area inside a FPGA.

SUMMARY

Principles of the present disclosure provide a field-effect quantum dot memory switch device including a channel region having a conductivity type and adjoining an electrically insulating substrate, doped source and drain regions operatively associated with and having the same conductivity type as the channel region, and a gate operatively associated with the channel region. A charge storage region including a semiconductor layer containing quantum structures, deep traps or combinations thereof is located between the gate and channel region and directly contacts the channel region. Carrier injection regions are in direct contact with the charge storage region for providing charges to the quantum structures, deep traps or combinations thereof. A gate dielectric layer is between the gate and the charge storage region.

An exemplary method provided in accordance with the principles of the disclosure includes providing a structure including an electrically insulating substrate, a channel region adjoining the electrically insulating substrate, and doped source and drain regions operatively associated with the channel region, the channel region and doped source and drain regions having the same conductivity type. A charge storage region is formed directly on the channel region, the charge storage region including a semiconductor layer containing quantum structures, deep traps or combinations thereof. A carrier injection layer in direct contact with the charge storage region is formed for providing charges to the quantum structures, deep traps or combinations thereof. The method further includes forming a gate dielectric layer on the charge storage region and forming a gate on the gate dielectric layer.

A further method includes providing a field-effect memory device including a channel region having a conductivity type and adjoining an electrically insulating substrate, doped source and drain regions operatively associated with and having the same conductivity type as the channel region, a gate operatively associated with the channel region, a charge storage region in direct contact with the channel region and comprising a semiconductor layer containing quantum structures, deep traps or combinations thereof between the gate and channel, injection regions in direct contact with the charge storage region for providing charges to the quantum structures, deep traps or combinations thereof, and a gate dielectric layer between the gate and the charge storage region. A gate bias is applied, causing the injection of carriers into the charge storage region. The method further includes causing the carriers to be retained by the quantum structures, deep traps or combinations thereof.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Junction field-effect quantum dot memory structures and fabrication methods as disclosed herein can provide substantial beneficial technical effects. For example, one or more embodiments may provide one or more of the following advantages:

Combined function of pass transistor and memory cell with relatively low programming and operation voltages;
Choice of device architectures;
Applicability to field-programmable gate arrays;
Spatial efficiency;

These and other features and advantages will become apparent from the following detailed description of illustrative embodiments thereof, which is to be read in connection with the accompanying drawings.

DETAILED DESCRIPTION

A dense binary memory switch that combines the function of a pass transistor and a memory cell with low programming and operation voltages is disclosed in accordance with exemplary embodiments as discussed below. The disclosed devices include channel regions similar to those found in junction field-effect transistors. A charge storage region is coupled to a gate electrode through a gate dielectric layer and in direct contact with a channel region. Methods for fabricating such memory switches at low temperatures compatible with back-end-of-the-line (BEOL) processing are further disclosed.

Figure 1:
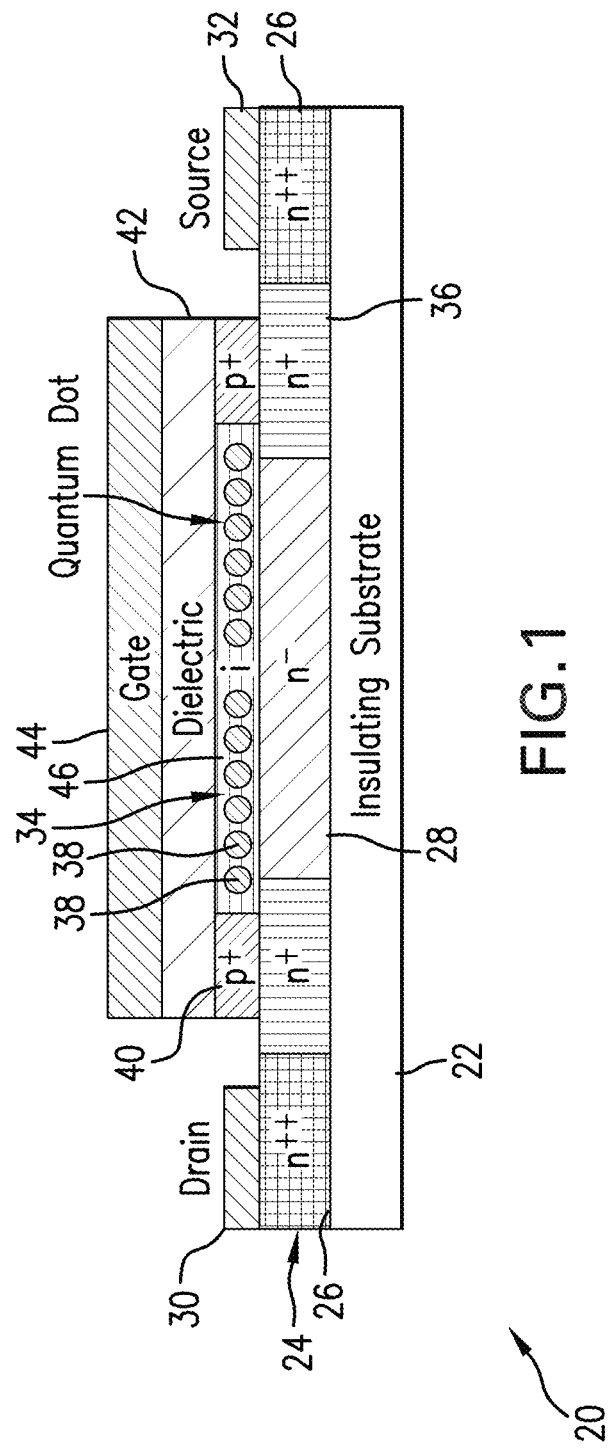
FIG. 1 is a schematic sectional view of an exemplary memory switch.

An exemplary device 20 designed to function as a "normally on" transistor structure is shown in FIG. 1. The device includes an electrically insulating layer 22 such as a buried oxide (BOX) layer. Silicon dioxide is among the materials from which the insulating layer may be formed. A semiconductor layer 24 including highly doped source and drain regions 26 and a channel region 28 adjoin the electrically insulating layer 22. The source and drain regions have the same conductivity type as the substrate semiconductor layer 24. In one or more exemplary embodiments, the source and drain regions 26 are n++ and the channel region is n−. (Terms such as n++, n+, p+ and n− refer to doping types and relative doping concentrations, exemplary doping levels being identified below. In p-type semiconductors, holes are the majority carriers whereas electrons are the majority carriers in n-type semiconductors.) The semiconductor layer further includes n+ regions 36 between the channel region 28 and source and drain regions 26. The function of the $n^+$ regions 36 is to avoid the full or excessive depletion of the semiconductor layer 24 underneath the $p^+$ injection regions 40. In preferred embodiments, the doping concentration of the n− channel region 28 is sufficiently low to ensure low operation voltages. If the $n^+$ region 36 is omitted, the depletion region width in the semiconductor layer 24 underneath the p+ region 40 may exceed or become very close to the thickness of the n-type semiconductor layer 24. The full depletion of the semiconductor layer 24 underneath the $p^+$ injection regions will prevent the current flow from source to drain regardless of the programming status of the device. If the depletion region width is smaller but too close to the semiconductor layer thickness, it results in excessively high series resistance at the source/drain. Therefore including the $n^+$ doped regions 36, which provide higher doping concentration and therefore smaller depletion region width, will prevent full or excessive depletion underneath the p+ regions 40 without increasing the operation voltage of the device. It should be understood that although the $n^+$ regions 36 are preferred in one or more embodiments, they are not fundamental to device operation and may be omitted in some embodiments. A drain electrode 30 is formed directly on one of the n++ regions 26 and a source electrode 32 is formed directly on the other of the regions 26. The semiconductor layer 24 is formed from laser-crystallized polysilicon in some exemplary embodiments.

A charge storage region 34 directly contacts the channel region 28. The charge storage region includes a semiconductor layer 46 containing quantum dots 38. In other embodiments, other quantum structures such as quantum wells or deep traps (i.e. originated from broken bonds within the semiconductor lattice) are used. The charge storage region accordingly includes a semiconductor layer containing quantum structures, deep traps or combinations thereof. In one or more embodiments, the semiconductor layer is an intrinsic semiconductor layer and the quantum dots are germanium nanodots. Organic materials such as pentacene may be employed to form an intrinsic semiconductor layer in some embodiments. The injection regions 40 are in direct contact with the charge storage region 34. The quantum dots 38 (and/or other charge storage elements) are charged by carrier injection from the injection regions 40. A gate dielectric layer 42 such as a high-k dielectric layer adjoins the storage region 34. A gate 44 adjoins the second dielectric layer. The quantum dots 38 are accordingly coupled to the gate 44 through the gate dielectric layer 42. The gate 44 at least partially overlies the injection regions 40 so that the gate electric field can reduce the potential barrier for carrier injection from the injection regions into the charge storage region 34.

Prior to programming, the exemplary device 20 is normally on. The term normally ON indicates the n− channel region 28 is not fully depleted, i.e. the portion of the depletion region width that lies in the n− channel region 28 is smaller than the thickness of the channel region 28. (This includes the areas both in the vicinity of the quantum dots and in areas in between the quantum dots). As known in the art, the depletion region width depends on various material properties and layer thicknesses used in the device structure, including the material type and doping of the n− channel region 28, the storage layer 34 and the quantum dots 38. In addition, the depletion region width can be affected by the material type and thickness of the dielectric 42, fixed charge and interfacial charge associated with the dielectric 42 (if present) and the workfunction of the gate electrode. In particular, the portion of the depletion region width that lies in the n− doped channel region 28 is reduced by increasing the electron concentration of the n− doped channel region 28 (which raises the quasi Fermi level for electrons in the n− doped channel region 28) and increased by increasing the hole concentration in the quantum dots 38 (which lowers the quasi Fermi level for holes in the quantum dots 38). The electron concentration in the n− doped channel region 28 is primarily provided by donor impurities, while the hole concentration in the quantum dots is primarily provided by transfer of holes into the quantum well (i.e. trapping due to quantum confinement). In one example where the quantum dots 38 are in direct contact with the n− doped channel region 28 (e.g. in the exemplary device 80 shown in FIG. 8), the junction formed between the quantum dots 38 and the channel region 28 is analogous to a p-n heterojunction. In another embodiment where the quantum dots 38 are in contact to the channel region 28 through a portion of the storage layer 34 and where the storage layer 34 is comprised of an intrinsic (i) semiconductor (e.g. in the exemplary device 20), a structure analogous to a p-i-n heterojunction is formed. A negative gate bias is applied to perform a write function. Upon application of a negative bias to the gate of the exemplary device 20, holes are injected from the injection regions 40 into the intrinsic semiconductor layer 46 and the quantum dots 38 therein. Provided that the negative bias is sufficiently large, the n− channel region 28 is fully depleted and the device turns off. This is because, as known in the art, the depletion region width in a p-n or p-i-n heterojunction is increased by applying a negative voltage across the junction. After write, the gate bias is removed and holes are retained in the quantum dots 38. Given sufficient hole retention in the quantum dots, the n− channel region remains fully depleted and the device remains off. This is because the trapped holes in the quantum dots 38 lower the quasi-Fermi level for holes in the quantum dots 38 and as a result increases the depletion region width in the n− doped channel region 28. If desired, a positive gate bias is applied to perform an erase function. Such a positive bias causes the removal of charge from the quantum dots 38. It should be noted that the exemplary device 20 may function as a volatile or non-volatile memory depending on the retention time of holes in the quantum dots 38. In some embodiments where a volatile memory is implemented, the erase function may be omitted.

Figure 2:
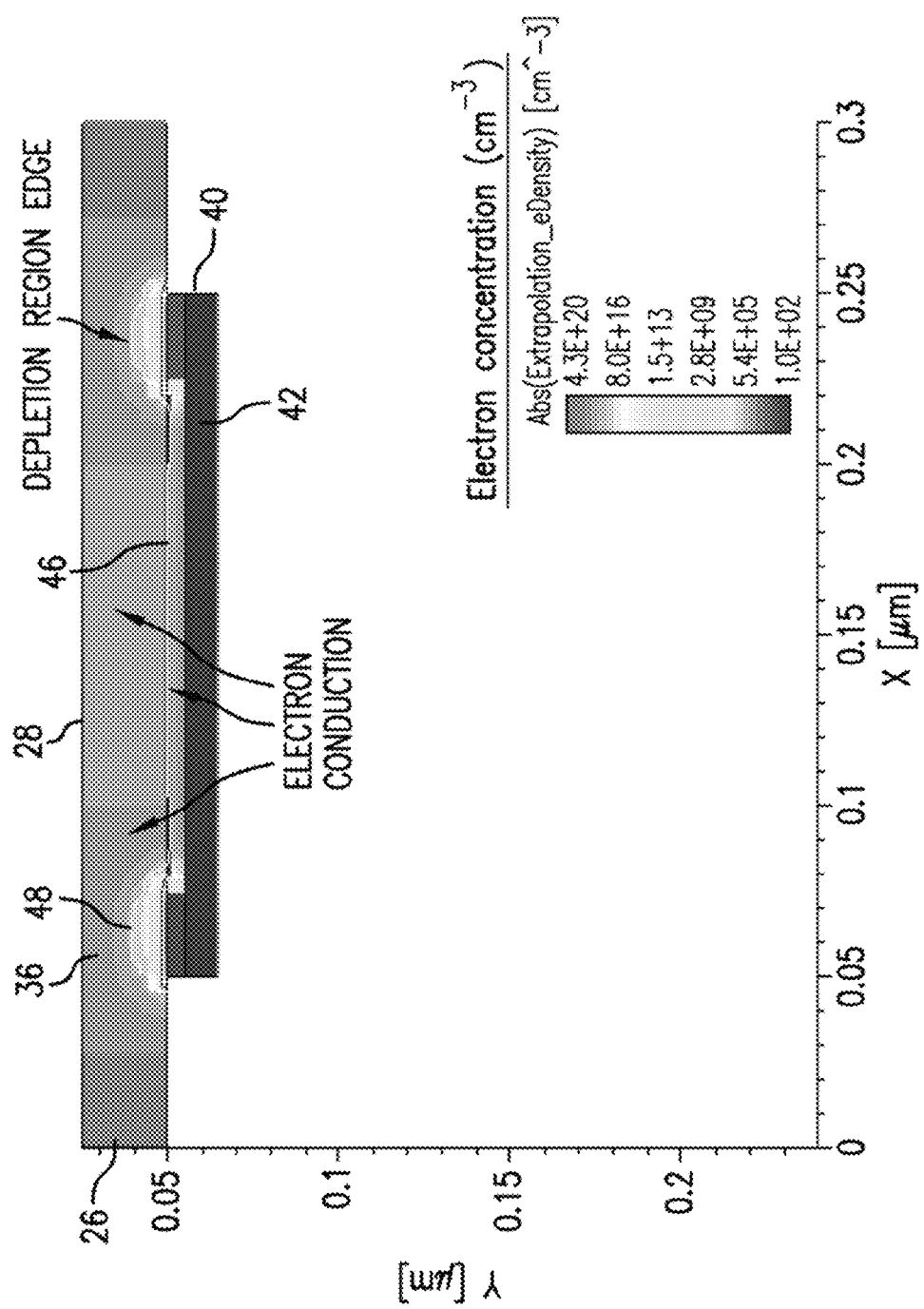
FIG. 2 is a technology computer-aided (TCAD) simulation of an exemplary memory switch without quantum dots showing areas of electron conduction when subjected to positive gate bias.
Figure 3:
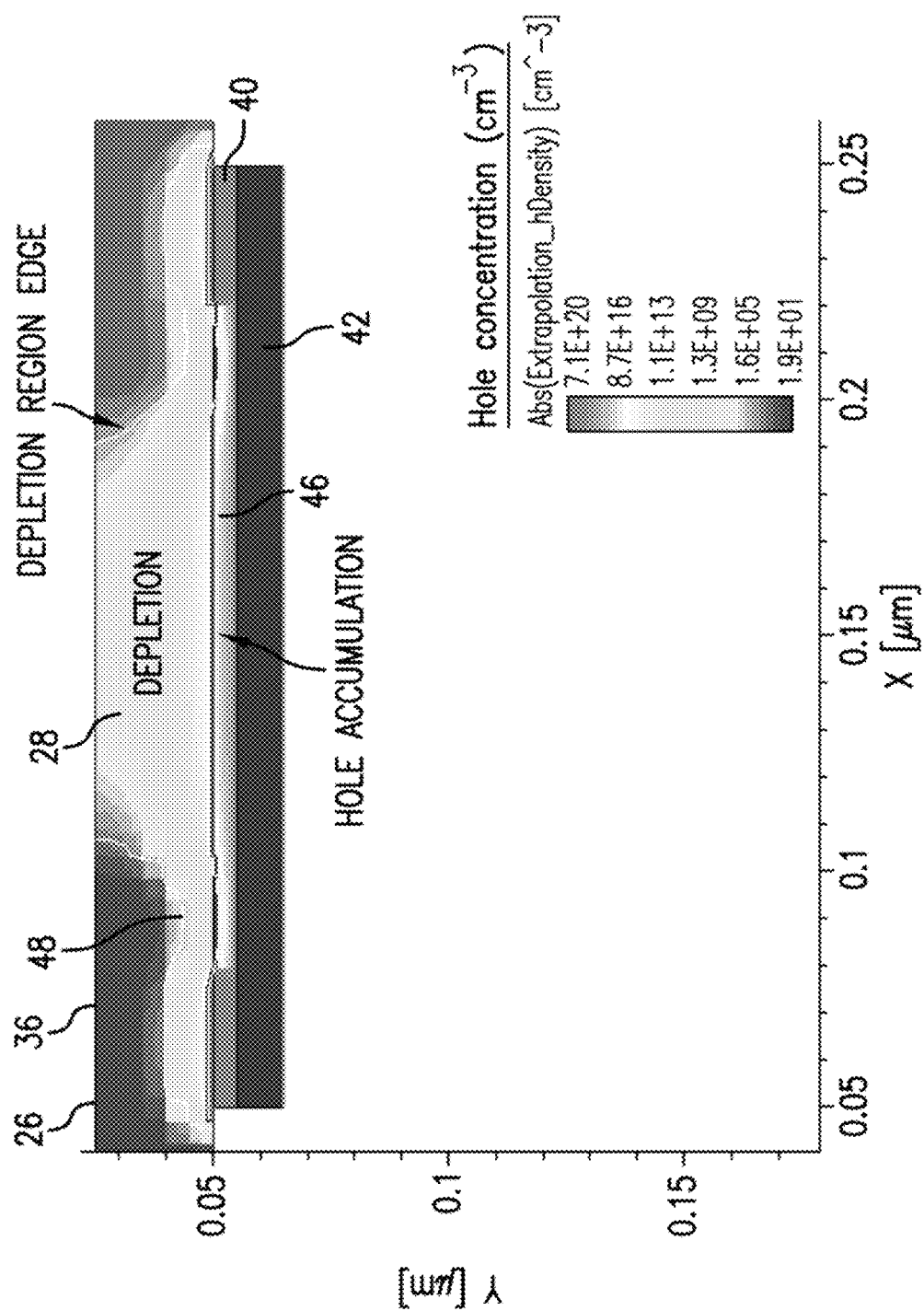
FIG. 3 is a technology computer-aided (TCAD) simulation of an exemplary memory switch without quantum dots showing areas of hole accumulation and electron depletion when subjected to negative gate bias.

FIG. 2 shows a technology computer-aided design (TCAD) simulation of an exemplary device without quantum dots, including dimensions. (Similar dimensions are employable and similar results would be obtained with a device including quantum dots or other quantum confinement elements.) Areas of electron conduction, namely the channel region 28 and charge storage region 34, when a positive gate bias is applied are shown. The depletion region edge 48 is further shown within the n+ regions 36 of the semiconductor layer 24. The n+ regions 36 adjoin the p+ contact regions 40 in the exemplary embodiment. FIG. 3 shows a technology computer-aided design (TCAD) simulation of an exemplary device without quantum dots upon the application of a negative gate bias. Similar results would be obtained with a device including quantum dots or other quantum confinement elements. It is understood that the primary function of quantum confinement elements such as quantum dots is to maintain charge over time. They are not expected to materially change the I-V characteristics of the device. Charge retention is a transient phenomenon. Hole accumulation in the storage region 34 and electron depletion in the channel region and adjoining regions are illustrated. The depletion region edge is further shown.

Figure 4:
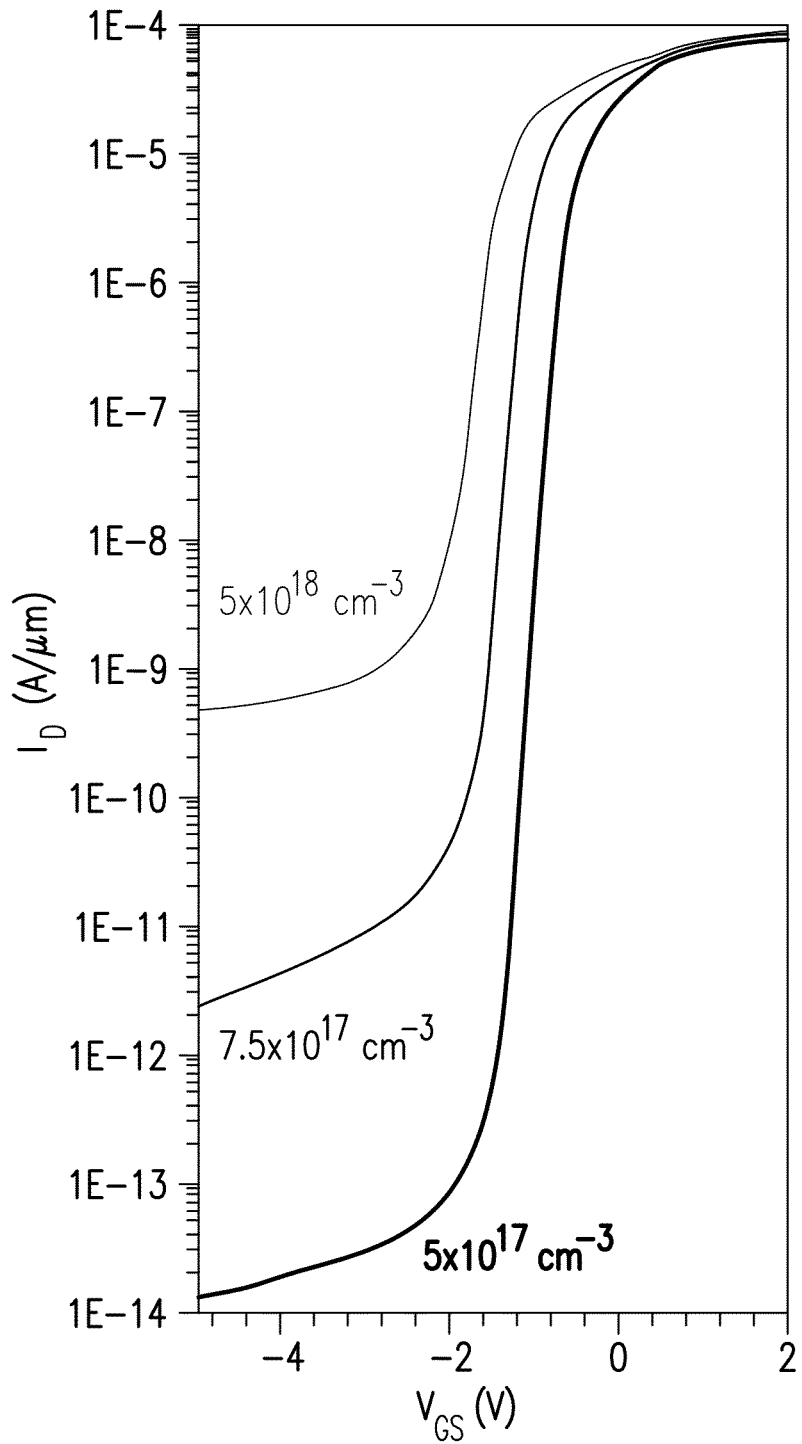
FIG. 4 is a graph showing drain current as a function of gate-source voltage $V_{GS}$ of an exemplary memory switch including three different channel region doping concentrations.
Figure 5:
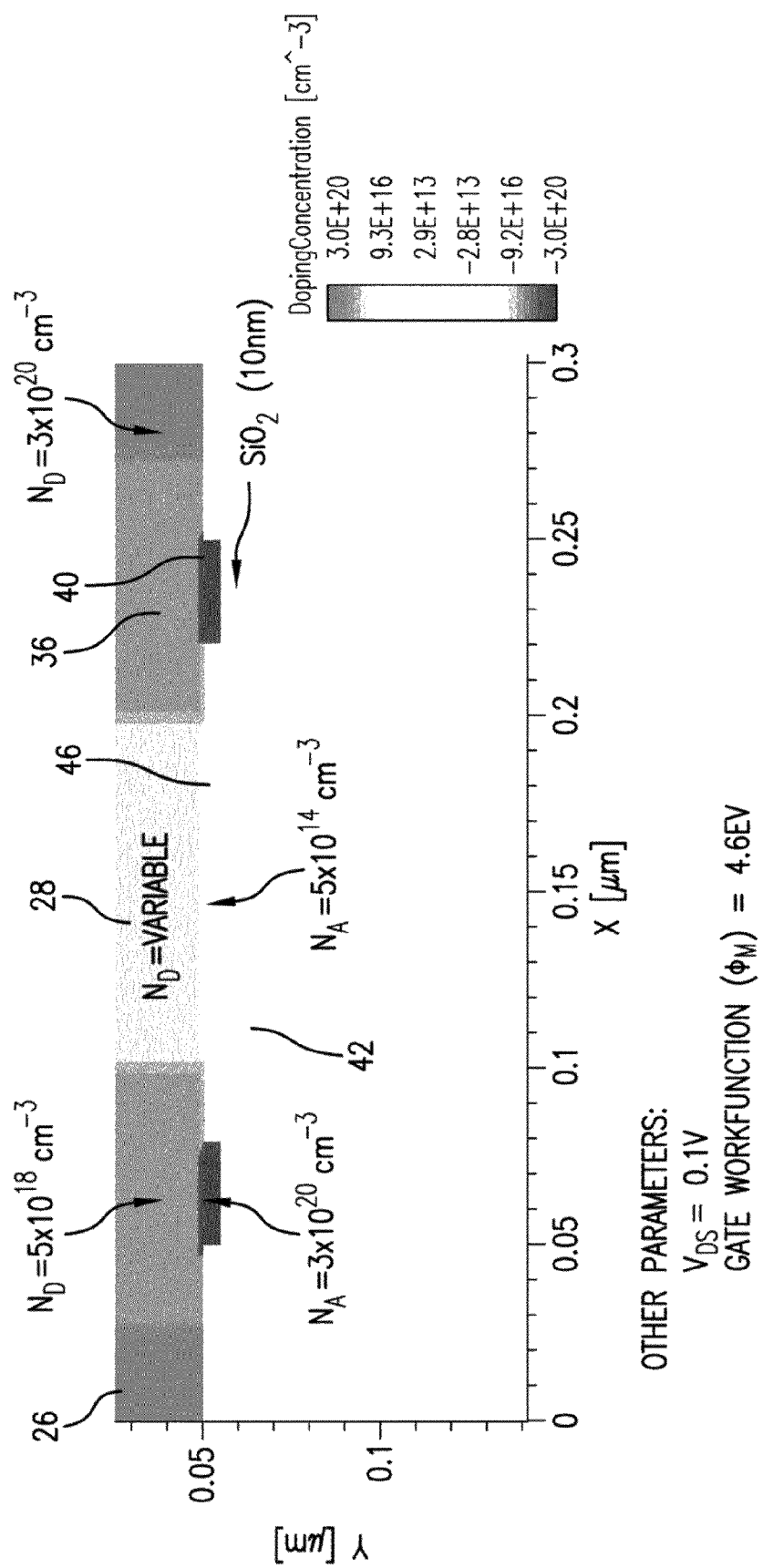
FIG. 5 is a technology computer-aided (TCAD) simulation of an exemplary memory switch showing doping concentrations of an exemplary memory switch.

FIG. 4 is a graph showing drain current as a function of gate-source voltage $V_{GS}$ of an exemplary device without quantum dots, as shown in FIG. 5, including three different exemplary channel region doping concentrations, namely $5 \times 10^{18}$ cm$^{-3}$, $7.5 \times 10^{17}$ cm$^{-3}$ and $5 \times 10^{17}$ cm$^{-3}$. The on/off ratio is significantly improved by reducing the doping concentration in the channel region of the devices discussed herein.

FIG. 5 shows a technology computer-aided design (TCAD) simulation of an exemplary device without quantum dots. The donor concentration $N_D$ in the channel region 28 is indicated as being variable. Three possible doping concentrations for the channel region 28 are described above with respect to FIG. 4. The n++ source and drain regions 26 each have donor concentrations of $3 \times 10^{20}$ cm$^{-3}$. The adjoining n+ regions 36 have donor concentrations of $5 \times 10^{18}$ cm$^3$. The storage region 34 has an acceptor concentration ($N_A$) of $5 \times 10^{14}$ cm$^{-3}$. The p+ injection regions 40 adjoining the storage region 34 have acceptor concentrations of $3 \times 10^{20}$ cm$^{-3}$. The gate work-function of the device is 4.6 eV and the drain-source voltage VDS is 0.1V. The gate dielectric layer 42 is a silicon dioxide layer having a thickness of ten nanometers. The dimensions of the layer including the charge storage region 34 and adjoining injection regions 40 are 200 nm×5 nm×1 µm in an exemplary embodiment. In this exemplary embodiment, the channel region 28, the n++ source and drain regions 26, the adjoining n+ regions 36, the storage region 34 and the p+ injection regions 40 are comprised of single crystalline Si.

Figure 6:
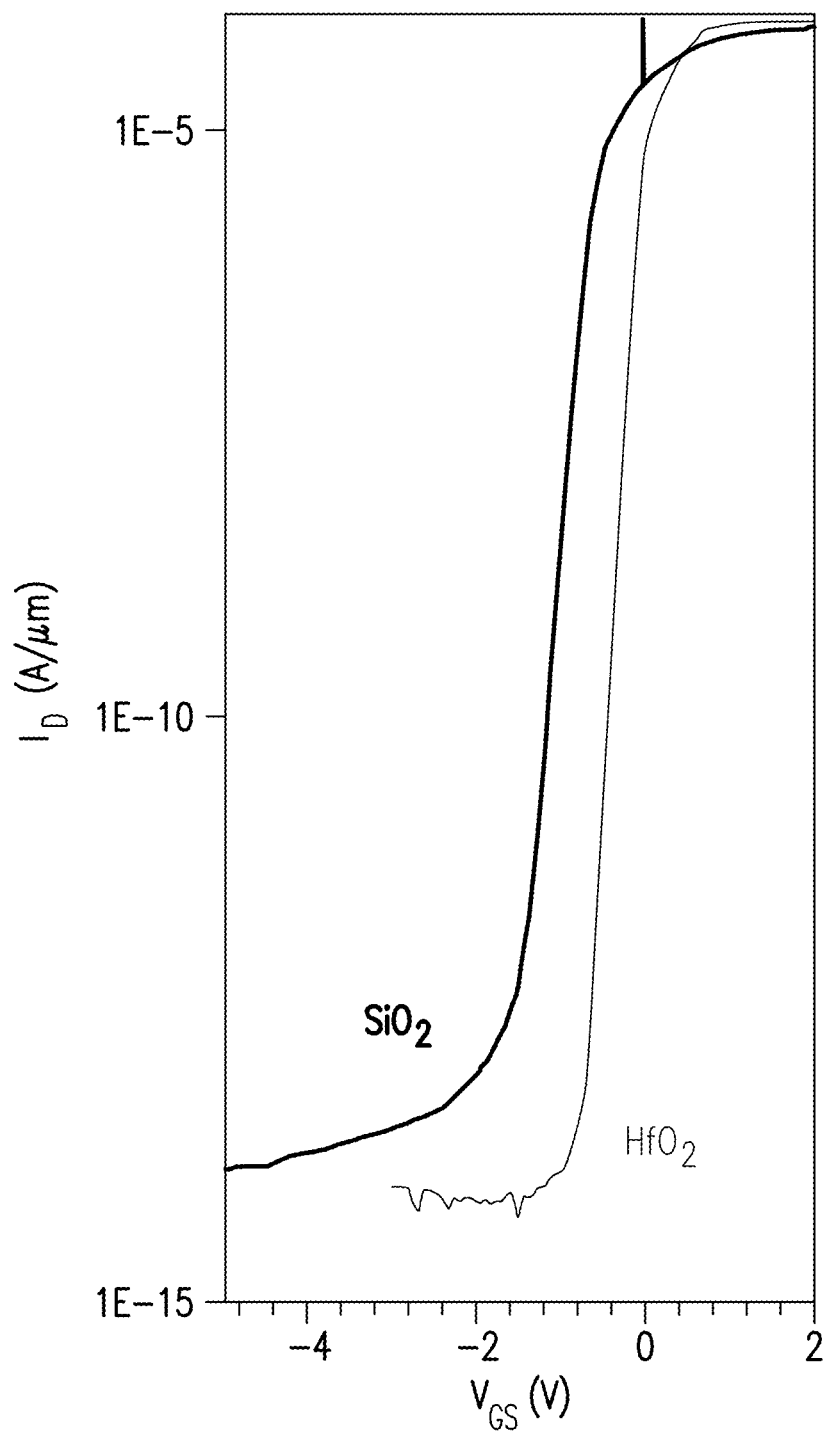
FIG. 6 is a graph showing drain current as a function of gate-source voltage $V_{GS}$ of an exemplary memory switch including two different gate dielectric materials.

FIG. 6 is a graph showing drain current as a function of gate-source voltage $V_{GS}$ of an exemplary device without quantum dots including two different gate dielectric materials, namely silicon dioxide and hafnium oxide. The graph is obtained employing a device as shown in FIG. 5 having a channel donor concentration of $5 \times 10^{17}$ cm$^{-3}$. Hafnium oxide having a thickness of 10 nm is substituted for silicon dioxide in the gate dielectric layer to illustrate the effect of employing a high-k dielectric layer in the device. Operation voltage is significantly reduced by using a high-k dielectric material such as hafnium oxide.

Figure 7:
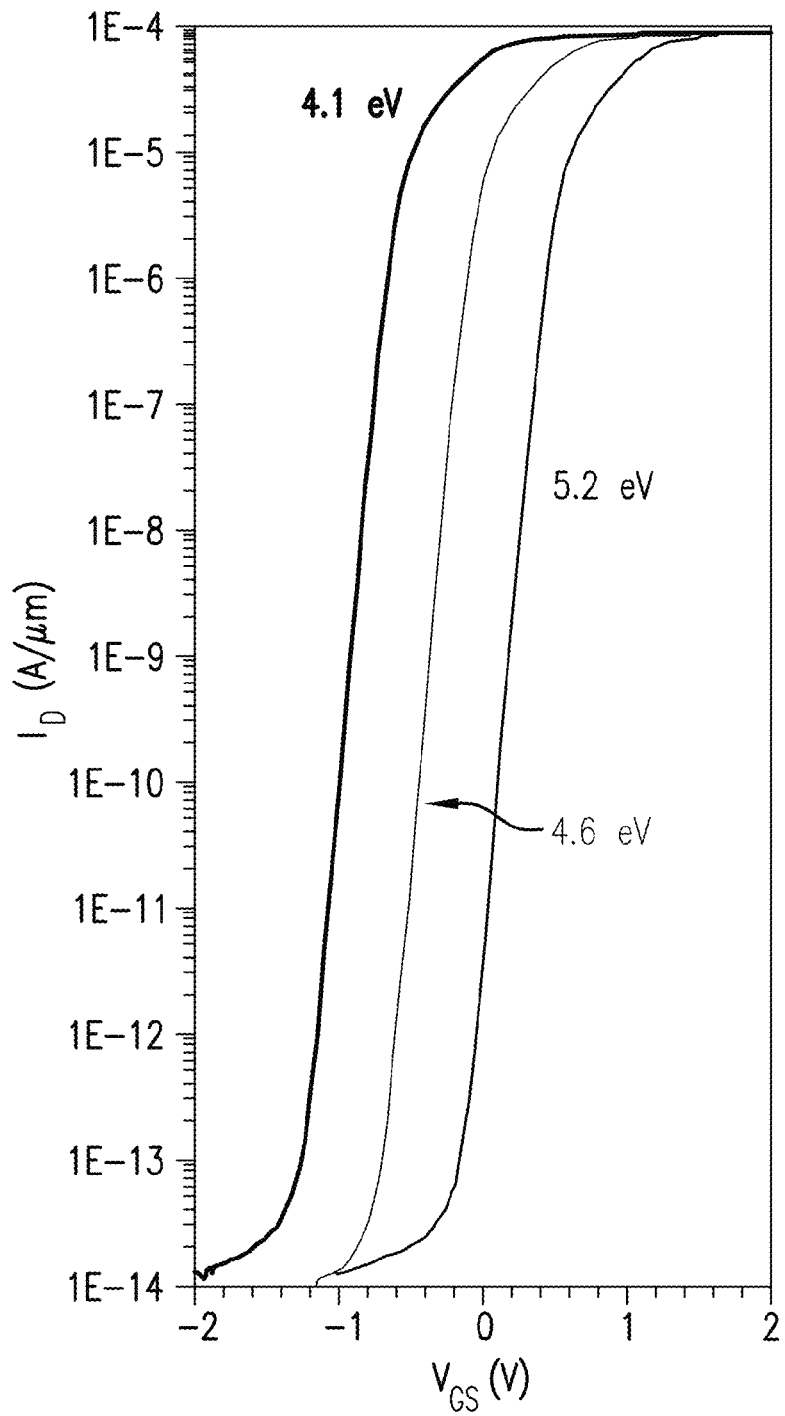
FIG. 7 is a graph showing drain current as a function of gate-source voltage $V_{GS}$ of an exemplary memory switch including three different gate work-function values.

FIG. 7 is a graph showing drain current as a function of gate-source voltage $V_{GS}$ of an exemplary memory switch as shown in FIG. 5 including three different gate work-function values. The channel donor concentration is $5 \times 10^{17}$ cm$^{-3}$ and the gate dielectric layer is a 10 nm thick layer of hafnium oxide. Results obtained employing gate materials having workfunctions of 4.1, 4.6 and 5.2 electron-volts are shown in FIG. 7. The hafnium oxide thickness of 10 nm corresponds to an equivalent oxide thickness (EOT) of approximately 1.5 nm. (The EOT of a dielectric layer is defined as the thickness of the dielectric layer times the ratio of the dielectric constant of silicon dioxide to the dielectric constant of the dielectric layer. The dielectric constants of silicon dioxide and hafnium oxide are 3.9 and 25, respectively). Operation voltage can be reduced by using a high-k gate dielectric instead of silicon dioxide. In addition, the operation voltage can be reduced by using a p+ polysilicon gate material which has a higher work-function (5.2 eV) compared to that of an n+ polysilicon gate material (4.1 eV).

One or more embodiments of the devices discussed herein may function as non-volatile or volatile multi-state memory. As known to those of skill in the art, the retention time is a function of the localization energy determined by quantum confinement in the well or dot. Estimated retention times of a wide variety of adjoining III-V and other materials have been calculated and are known in the art. For example, the storage times of Si/Ge and GaAs$_{0.4}$Sb$_{0.6}$/GaAs are relatively short while the storage times of GaSb/GaAs, In$_{0.5}$Ga$_{0.5}$Sb/GaAs and InSb/GaAs are relatively long. The localization energy depends on band offsets as well as doping and/or bias. Metals in organic material, as employed in one or more embodiments, also provide varying retention times. For example, gold nanodots in pentacene exhibit a retention time of a few hours.

Figure 8:
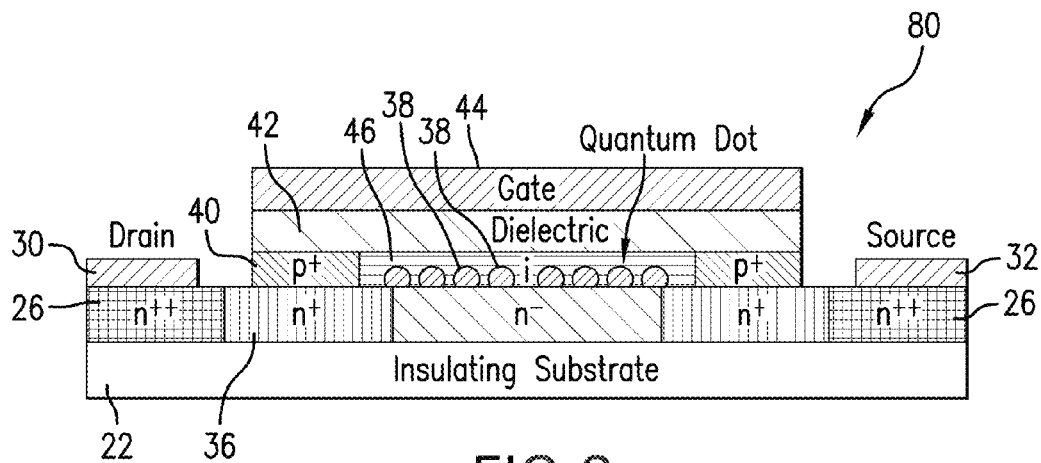
FIG. 8 is a schematic sectional view of an alternative embodiment of a binary memory switch including quantum dots in direct contact with a channel region.
Figure 9:
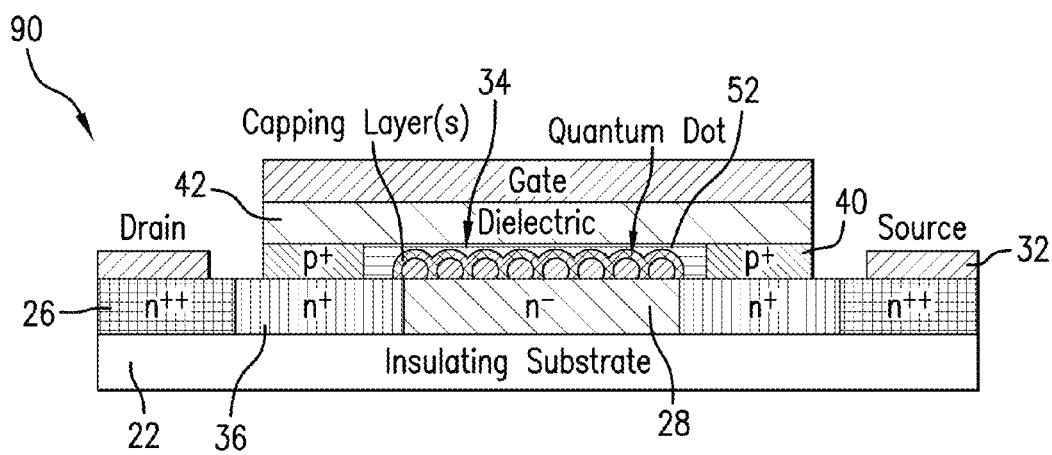
FIG. 9 is a schematic sectional view of an alternative embodiment of a binary memory switch including quantum dots encased by a capping layer
Figure 10:
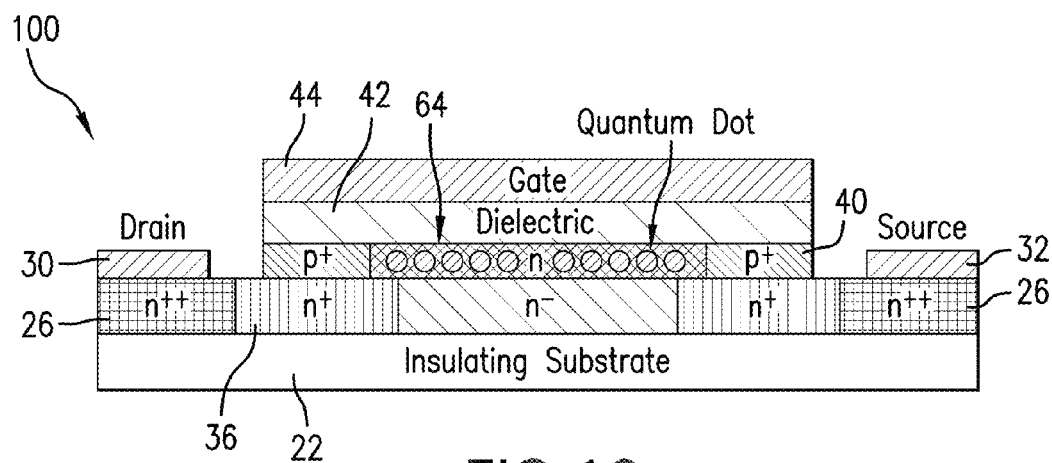
FIG. 10 is a schematic sectional view of an alternative embodiment of a binary memory switch including a charge storage region having the same conductivity type as the channel region.

Further exemplary embodiments of junction field-effect quantum dot memory switch devices are shown in FIGS. 8, 9 and 10. The same reference numerals as employed with respect to FIG. 1 are employed in these figures to designate similar elements. In the exemplary device 80 shown in FIG. 8, the quantum dots 38 are in direct contact with the channel region 28. In other embodiments (not shown), the quantum dots are in direct contact with the gate dielectric layer 42. In some embodiments (not shown), the quantum dots include a core (or cores) and a shell (or shells).

The charge storage region 34 is a bi-layer or multilayer structure in some embodiments. A layer or set of layers may serve as a capping layer 52 encasing the quantum dots 38 as shown in FIG. 9. The quantum dots 38 are positioned between the capping layer 52 and the channel region 28. The capping layer 52 may be a continuous layer as shown in the exemplary device 90 or discontinuous. The capping layer may further be in direct contact with the dielectric layer 42 (not shown). Several material combinations known as core-shell quantum-dots in the art may be used for this purpose. The shell material has a larger bandgap than the core material, thus improving charge retention in the core material. In one example, the core material is comprised of germanium and the shell material is comprised of amorphous silicon. In another example, the core material is comprised of silicon and the shell material is comprised of a very thin layer (<2 nm) of silicon dioxide.

Figure 11A:
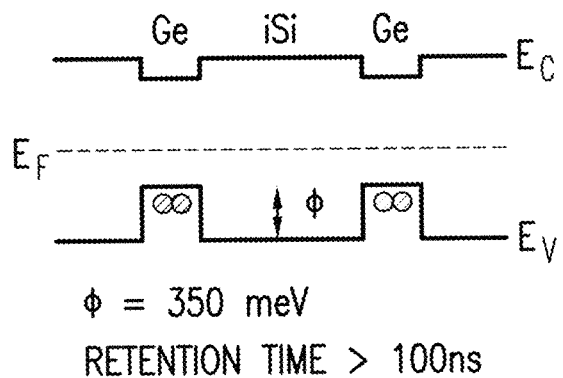
FIG. 11A is a schematic energy band diagram of a device including germanium quantum dots embedded in an intrinsic silicon semiconductor layer.
Figure 11B:
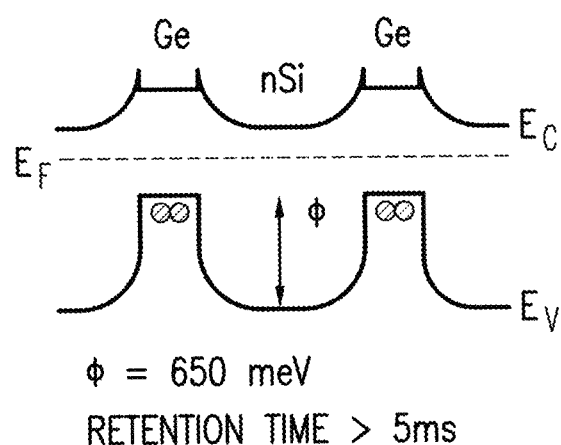
FIG. 11B is a schematic energy band diagram of a device including germanium quantum dots embedded in a n-doped silicon semiconductor layer.

In some embodiments, the charge storage region 64 has the same conductivity type as the channel region 28. Referring to the device 100 shown in FIG. 10, the charge storage region 64 includes n-type doping. In embodiments, the retention time is substantially improved time, though at a cost of a higher programming voltage. Energy band diagrams provided in FIGS. 11A and 11B illustrate, respectively, the differences in write voltage and retention times of devices employing intrinsic silicon layers and n-type silicon layers containing germanium quantum dots as well as effects within conduction and valence bands of such devices. The same concept may be expanded to materials systems other than germanium dots in silicon by those skilled in the art.

Figure 12A:
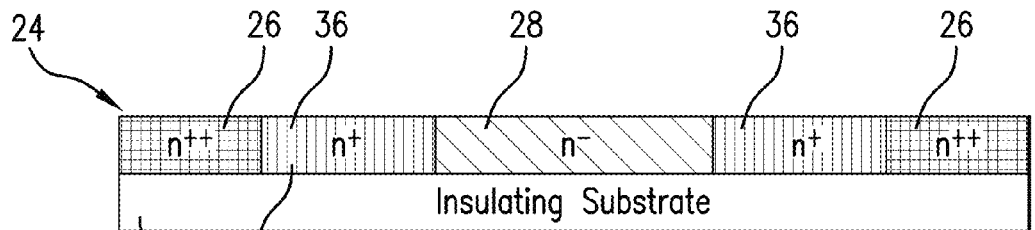
FIGS. 12A-D are schematic illustrations of exemplary fabrication steps for a BEOL-compatible device.
Figure 12B:
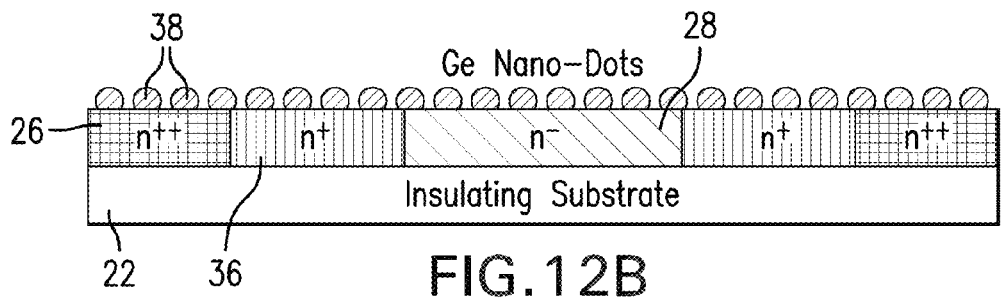
Figure 12C:
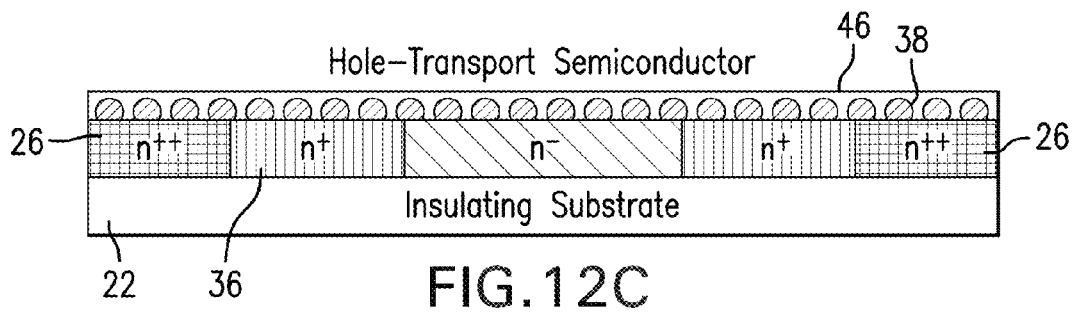
Figure 12D:
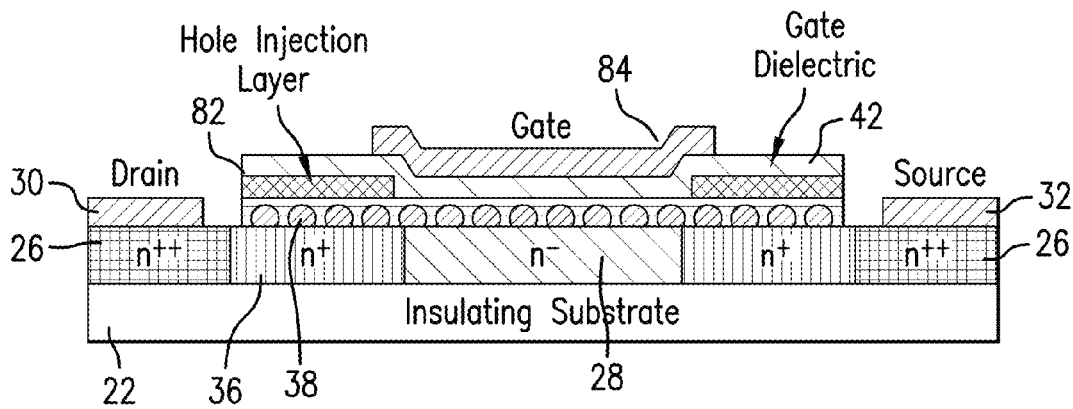
Figure 13:
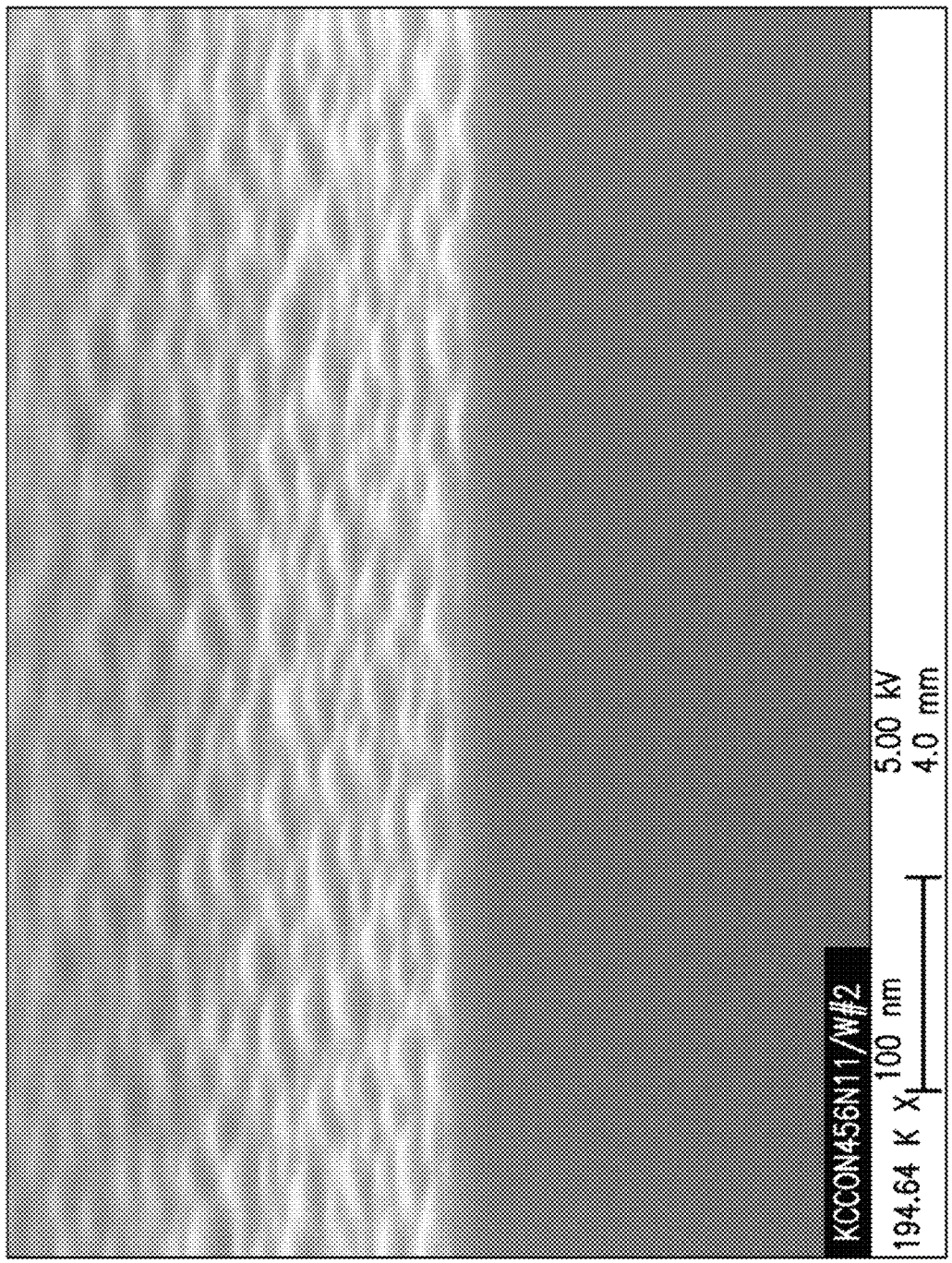
FIG. 13 is a transmission electron microscope image showing germanium particles grown on silicon, and FIG. 14 a schematic, cross-sectional view of an exemplary normally-off memory switch.

Referring to FIGS. 12A-D, an exemplary method is shown for fabricating back-end-of-line (BEOL) compatible devices. Doped source and drain regions 26, n+ regions 36 and the channel region 28 are formed using conventional techniques, for example, ion implantation of an n− semiconductor-on-insulator substrate. In an exemplary embodiment, the semiconductor layer 24 is laser-crystallized polysilicon. Germanium nanodots 38 are formed on the silicon substrate. In some exemplary embodiments, rapid thermal chemical vapor deposition is used at temperatures below 400° C. from a germane ($GeH_4$) precursor. Dot size in one or more embodiments is 5-50 nm. A dot size range of 5-25 nm for embodiments including germanium nanodots is employed in other embodiments. A hole-transport semiconductor layer 46 is deposited using known techniques. Exemplary materials for forming the semiconductor layer 46 include an organic material such as pentacene, nickel oxide (NiO), tin oxide (SnO), and CZTS (copper/zinc/tin/sulfur) materials. A hole injection layer 82 (high workfunction metal or p-type semiconductor), gate dielectric layer 42, gate electrode 84, and drain and source electrodes 30, 32 are deposited and patterned using conventional techniques familiar to those of skill in the art. The gate dielectric layer 42 can be formed using any known technique including but not limited to thermal oxidation, deposition by thermal or e-beam evaporation, sputtering, atomic-layer deposition (ALD) or various chemical vapor deposition (CVD) methods known in the art. In an exemplary embodiment wherein pentacene is used to form the hole-transport semiconductor layer 46, the hole injection layer is a high workfunction metal such as gold, platinum or palladium. In a further exemplary embodiment that also includes a pentacene layer, the gate dielectric layer 42 is a parylene layer or an aluminum oxide ($Al_2O_3$) layer. In embodiments including germanium nano-dots formed on a silicon channel region, germanium particles can be grown at 425° C. and covered with amorphous silicon prior to deposition of the hole-transport semiconductor layer 46. Growth of germanium nano-dots at temperatures lower than 400° C. is also possible. FIG. 13 shows an exemplary embodiment of germanium nano-dots formed on silicon and covered with amorphous silicon. In one embodiment, the quantum dots 38 are comprised of metal gold nano-particles, the storage layer 46 is comprised of pentacene, and the injection region 40 is comprised of a high-workfunction metal such as gold, platinum or palladium. In one example, the gold nanodots are formed by flash-evaporation of gold, as known in the art. In this method, gold is evaporated in a vacuum chamber using known techniques and a shutter (used for physically blocking the sample from gold evaporation) is opened only for a short period of time to allow deposition on the sample. When the shutter is closed, gold is deposited on the shutter rather than on the sample. Short deposition times result in nanodot formation on the surface of the dielectric layer rather than a continuous layer of gold. In one example, an evaporation rate of 1 Å/sec and an evaporation time (the period the shutter is open) of five (5) seconds is used. In another example, an evaporation rate of 0.1 Å/sec and an evaporation time of fifty (50) seconds are used. In another example, an evaporation rate of 1 Å/sec and an evaporation time of ten (10) seconds are used. The evaporation rate and time are chosen such that the product of the evaporation time and evaporation rate is preferably lower than 2 nm and more preferably lower than 1 nm. (1 nm=10 Å, A=angstrom). A layer of pentacene is evaporated first, followed by flash evaporation of gold, as described above, followed by the evaporation of a second layer of pentacene. Therefore, the gold nano-dots are embedded within a layer of pentacene. In other embodiments, the second pentacene evaporation is omitted so that the gold nano-dots are in direct contact with the dielectric layer 42. In some other embodiments, multiple steps of gold and pentacene evaporation may be used to form more than one layer of gold nano-dots. In some embodiments, the gold nano-dots are distributed randomly within the pentacene charge storage region. In one example, the gold nano-particles are mixed in a solution containing a pentacene precursor such as 13,6-N-Sulfinylacetamidopentacene, and applied by spin-coating and cured to form a pentacene layer containing gold nano-particles. A solvent such as chloroform, chlorobenzene or combinations thereof may be used to prepare the solution. Curing may be performed at temperatures close to 200° C. in a dry atmosphere, although lower temperatures may be used as well. In some embodiments, other organic materials and/or other metal nano-particles are used.

Figure 14:
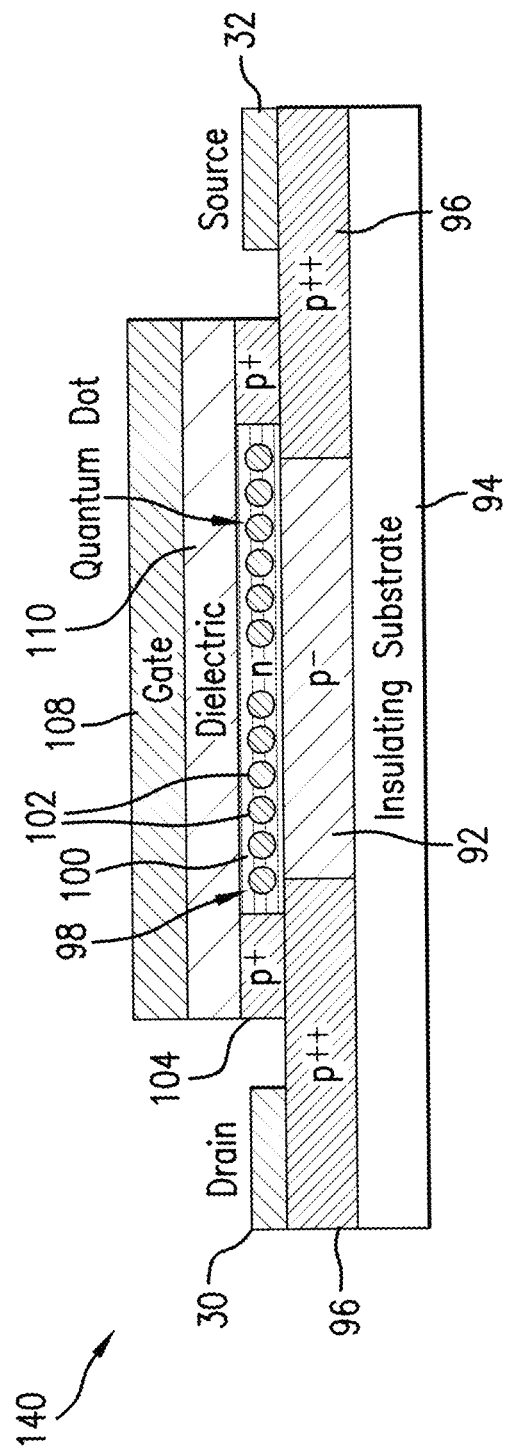

A normally-off junction field-effect quantum dot memory switch device is provided in accordance with one or more further embodiments. The term normally OFF indicates at least one of the portion of p− doped channel region 92 at the vicinity of the quantum dots and the portion of the p− doped channel region in between the quantum dots 102 is fully depleted. This is hereafter referred to as a fully depleted channel. Referring to FIG. 14, the device 140 includes a p− channel region 92 formed on an electrically insulating substrate 94. The channel region 92 is fully depleted before programming, resulting in a normally-off transistor structure. Highly doped p++ source and drain regions 96 adjoin the channel region 92. The storage region 98 includes an n-type semiconductor layer 100 containing quantum dots 102. In some embodiments, the storage layer 98 is comprised of an intrinsic semiconductor (not shown). Charge injection regions 104 are p+ and directly contact the charge storage region 98. The charge storage region 98 is in direct contact with the channel region 92. A gate electrode 108 and gate dielectric layer 110 are formed above the charge storage region and associated injection regions 104. When a write voltage (negative gate bias) is applied to the device 140, holes are induced in the n-type semiconductor layer 100 and quantum dots 102 while the p− channel region 92 is un-depleted and the device turns "on". The quantum dots 102 are charged by carrier injection from the p+ injection regions 104. After "write", the gate bias is removed, the holes are retained in the quantum dots 102, and the channel region 92 remains un-depleted. The transistor device accordingly remains on. A positive gate bias is applied to remove charge from the quantum dots, thereby performing an erase function. The erase function may be omitted in volatile memory devices.

Given the discussion thus far and with reference to the exemplary embodiments discussed above and the drawings, it will be appreciated that, in general terms, an exemplary field-effect quantum dot memory device includes a channel region

28 having a conductivity type and adjoining an electrically insulating substrate 22. Doped source and drain regions 26 are operatively associated with and have the same conductivity type as the channel region. In the structure 20 shown in FIG. 1, the channel region and associated source and drain regions are n-type. The device 140 shown in FIG. 14 includes p-type channel, source and drain regions. A gate 44 is operatively associated with the channel. A charge storage region 34 (element 98 in FIG. 9) including a semiconductor layer containing quantum structures, deep traps or combinations thereof (e.g. quantum dots 38) is between the gate and channel region. Carrier injection regions (26 in FIG. 1, 104 in FIG. 9) are in direct contact with the charge storage region for providing charges to the quantum structures, deep traps or combinations thereof. The charge storage region is in direct contact with the channel region but does not comprise part of the channel region. A gate dielectric layer is between the gate and the charge storage region. The carrier injection regions are high workfunction metal in some embodiments and p-type semiconductor regions in some embodiments. Quantum dots directly contact the channel region 28 in one or more embodiments, such as shown in FIG. 8. In other embodiments as shown in FIGS. 1, 10 and 14, quantum dots provided within the charge storage region do not contact the channel region.

An exemplary fabrication method includes providing a structure including an electrically insulating substrate, a channel region adjoining the electrically insulating substrate, and doped source and drain regions operatively associated with the channel region, the channel region and doped source and drain regions having the same conductivity type. A charge storage region is formed directly on the channel region, the charge storage region including a semiconductor layer containing quantum quantum structures (e.g. quantum dots), deep traps or combinations thereof. FIG. 12C shows an exemplary structure following formation of a charge storage region. A carrier injection layer is formed in direct contact with the charge storage region for providing charges to the quantum quantum structures, deep traps or combinations thereof. A gate dielectric layer is formed on the charge storage region, and a gate is formed on the gate dielectric layer. FIG. 12D shows a structure wherein the carrier injection layer is a hole injection layer 82 such as a high workfunction metal layer or a p-type semiconductor region. Quantum structures such as germanium nano-dots are employed in some exemplary embodiments.

A further exemplary method includes providing a field-effect memory device including: i) a channel region having a conductivity type and adjoining an electrically insulating substrate, ii) doped source and drain regions operatively associated with and having the same conductivity type as the channel region, iii) a gate operatively associated with the channel region; iv) a charge storage region in direct contact with the channel region and comprising a semiconductor layer containing quantum structures, deep traps or combinations thereof between the gate and channel, v) injection regions in direct contact with the charge storage region for providing charges to the quantum structures, deep traps or combinations thereof, and vi) a gate dielectric layer between the gate and the charge storage region. FIGS. 1, 8-10 and 14 show exemplary memory devices. A gate bias is applied, causing the injection of carriers (electrons or holes) into the charge storage region. The carriers are retained by the quantum structures, deep traps or combinations thereof. In some embodiments, the method further includes applying a further gate bias to remove the carriers from the quantum structures, deep traps or combinations thereof. In embodiments where the carriers are holes, a negative gate bias is applied to cause the injection of carriers and the further gate bias is positive. Retention time is better for holes than electrons in some embodiments as holes have a larger effective mass in many materials.

Those skilled in the art will appreciate that the exemplary structures discussed above can be distributed in raw form or incorporated as parts of intermediate products or end products that benefit from having memory devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A field-effect memory device comprising:
   a channel region having a conductivity type and adjoining an electrically insulating substrate;
   doped source and drain regions operatively associated with and having the same conductivity type as the channel region;
   a gate operatively associated with the channel region;
   a charge storage region including a semiconductor layer containing quantum structures, deep traps or combinations thereof, the charge storage region being located between the gate and channel region and directly contacting the channel region;
   carrier injection regions in direct contact with the charge storage region for providing charges to the quantum structures, deep traps or combinations thereof, and
   a gate dielectric layer between the gate and the charge storage region.

2. The field-effect memory device of claim 1, wherein the semiconductor layer of the charge storage region is an intrinsic semiconductor layer.

3. The field-effect memory device of claim 1, wherein the carrier injection regions are doped p-type regions for inducing holes in the quantum structures, deep traps or combinations thereof.

4. The field-effect memory device of claim 3, wherein the channel region and source and drain regions are n-type.

5. The field-effect memory device of claim 1, wherein the charge storage region contains quantum dots in direct contact with the channel region.

6. The field-effect memory device of claim 1, wherein the channel region includes an organic semiconductor layer.

7. The field-effect memory device of claim 1, wherein the charge storage region contains germanium nano-dots and the semiconductor layer comprises silicon.

8. The field-effect memory device of claim 1, wherein the charge storage region contains quantum dots.

9. The field-effect memory device of claim 1, wherein the channel region, the source and drain regions, and the carrier injection regions are p-type.

10. A method comprising:
providing a structure including an electrically insulating substrate, a channel region adjoining the electrically insulating substrate, and doped source and drain regions operatively associated with the channel region, the channel region and doped source and drain regions having the same conductivity type;
forming a charge storage region directly on the channel region, the charge storage region including a semiconductor layer containing quantum structures, deep traps or combinations thereof;
forming a carrier injection layer in direct contact with the charge storage region for providing charges to the quantum structures, deep traps or combinations thereof;
forming a gate dielectric layer on the charge storage region, and
forming a gate on the gate dielectric layer.

11. The method of claim 10, wherein the semiconductor layer is a hole-transport layer and the carrier injection layer is a hole injection layer.

12. The method of claim 10, wherein the carrier injection layer includes a p-type semiconductor contact region.

13. The method of claim 10, wherein the carrier injection layer includes a high workfunction metal layer.

14. The method of claim 10, the step of forming the charge storage region further includes growing germanium nano-dots.

15. The method of claim 14, wherein the germanium nano-dots have diameters in the range of 5-25 nm.

16. The method of claim 10, wherein the channel region and source and drain regions are n-type.

17. The method of claim 1, wherein the semiconductor layer of the charge storage region includes quantum dots, further including forming the quantum dots directly on the channel region.

18. A method comprising:
providing a field-effect memory device including:
a channel region having a conductivity type and adjoining an electrically insulating substrate;
doped source and drain regions operatively associated with and having the same conductivity type as the channel region;
a gate operatively associated with the channel region;
a charge storage region in direct contact with the channel region and comprising a semiconductor layer containing quantum structures, deep traps or combinations thereof between the gate and channel;
injection regions in direct contact with the charge storage region for providing charges to the quantum structures, deep traps or combinations thereof, and
a gate dielectric layer between the gate and the charge storage region;
applying a gate bias, causing the injection of carriers into the charge storage region, and
causing the carriers to be retained by the quantum structures, deep traps or combinations thereof.

19. The method of claim 18, further including applying a further gate bias to remove the carriers from the quantum structures, deep traps or combinations thereof.

20. The method of claim 18, wherein the semiconductor layer of the charge storage region contains quantum dots and the carriers are holes.

* * * * *